United States Patent [19]
Fulford, Jr.

[11] Patent Number: 5,770,493
[45] Date of Patent: Jun. 23, 1998

[54] METHOD OF MAKING NMOS AND PMOS DEVICES WITH SIMULTANEOUSLY FORMED GATES HAVING DIFFERENT GATE LENGTHS

[75] Inventor: H. Jim Fulford, Jr., Austin, Tex.

[73] Assignee: Advanced Micro Devices, Inc., Sunnyvale, Calif.

[21] Appl. No.: 805,538

[22] Filed: Feb. 25, 1997

[51] Int. Cl.$^6$ ............................................. H01L 21/8238
[52] U.S. Cl. ........................................ 438/199; 438/303
[58] Field of Search ................................... 438/199, 303

[56] References Cited

PUBLICATIONS

U.S. Patent Application Serial No. 08/623,802, filed Mar. 29, 1996, entitled "Method of Processing a Semiconductor Wafer for Controlling Drive Current", by Fulford, Jr. et al (copy not enclosed).

*Primary Examiner*—John Niebling
*Assistant Examiner*—Long Pham
*Attorney, Agent, or Firm*—Skjerven, Morrill, MacPherson, Franklin & Friel, LLP; David M. Sigmond

[57] ABSTRACT

A method of making NMOS and PMOS devices with different gate lengths is disclosed. The method includes providing a semiconductor substrate with first and second active regions, forming a gate material over the first and second active regions, forming a photoresist layer over the gate material, irradiating the photoresist layer with a first image pattern over the first active region wherein the first image pattern has a first radiation energy per unit area of the photoresist layer, irradiating the photoresist layer with a second image pattern over the second active region wherein the second image pattern has a second radiation energy per unit area of the photoresist layer, and etching the gate material to simultaneously form a first gate over the first active region and a second gate over the second active region. Preferably, the first and second gates have different lengths due to the first and second image patterns having different exposure times. The invention is well-suited for adjusting the drive current ratio of NMOS and PMOS devices in a CMOS inverter circuit.

20 Claims, 5 Drawing Sheets

METHOD OF MAKING NMOS AND PMOS DEVICES WITH SIMULTANEOUSLY FORMED GATES HAVING DIFFERENT GATE LENGTHS

BACKGROUND OF THE INVENTION

1. Field of the Invention

The present invention relates to integrated circuit manufacturing, and more particularly to insulated-gate field-effect transistors.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, the polysilicon is anisotropically etched to provide a gate which provides a mask during formation of the source and drain by ion implantation, and then the implanted dopant is activated using a high-temperature anneal.

As IGFET dimensions are reduced and the supply voltage remains constant (e.g., 3V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. The drain is typically formed by two ion implants. A light implant is self-aligned to the gate, and a heavy implant is self-aligned to the gate on which sidewall spacers have been formed. The spacers are typically oxides or nitrides. The purpose of the lighter first dose is to form a lightly doped region of the drain (or LDD) at the edge near the channel. The second heavier dose forms a low resistivity region of the drain, which is subsequently merged with the lightly doped region. Since the heavily doped region is farther away from the channel than a conventional drain structure, the depth of the heavily doped region can be made somewhat greater without adversely affecting the device characteristics.

Complementary metal-oxide semiconductor (CMOS) circuits include N-channel (NMOS) devices and P-channel (PMOS) devices. Conventional processes typically use N-well masks and P-well masks early in the processing sequence to define the NMOS and PMOS regions. Conventional process also typically include a single masking step for forming the gates for the NMOS and PMOS devices, separate masking steps for implanting lightly doped N-type source/drain regions into the NMOS device and lightly doped P-type source/drain regions in the PMOS device, formation of spacers adjacent to the gates of the NMOS and PMOS devices, and then separate masking steps for implanting heavily doped N-type source/drain regions into the NMOS device and heavily doped P-type source/drain regions into the PMOS device.

In CMOS circuits, it may be desirable to form the NMOS and PMOS devices with different gate lengths (or critical dimensions). For instance, if the NMOS and PMOS devices are intended to have similar channel lengths, and the NMOS source/drains are doped with arsenic and the PMOS source/drains are doped with boron, then a shorter NMOS gate length may be desirable since boron diffuses far more rapidly than arsenic during high-temperature processing. Likewise, to obtain a predetermined drive current ratio of the NMOS and PMOS devices, for instance in an inverter circuit, then independently adjusting the gate lengths of the NMOS and PMOS devices can be useful since the drive current is a function of channel length.

It is possible to provide different gate lengths for the NMOS and PMOS devices by employing a single reticle that defines the desired gate lengths, patterning a photoresist layer above the gates using an image pattern from the reticle, and simultaneously etching the gates. Unfortunately, the difference in length between feature sizes on a given reticle is often limited to a given increment, which in turn limits the difference in length between feature sizes of an image pattern generated by projecting radiation through the reticle and a lens onto the photoresist layer. If, for instance, the difference in feature sizes of the image pattern is adjustable in increments of 500 angstroms, yet the desired difference in gate lengths is on the order of 50 to 300 angstroms, then the conventional approach does not suffice.

Accordingly, a need exists for an improved method of making a N-channel and P-channel devices with different gate lengths.

SUMMARY OF THE INVENTION

An object of the present invention is to provide N-channel and P-channel devices with different gate lengths.

In accordance with one aspect of the invention, a method of forming N-channel and P-channel devices with different gate lengths includes providing a semiconductor substrate with first and second active regions, forming a gate material over the first and second active regions, forming a photoresist layer over the gate material, irradiating the photoresist layer with a first image pattern over the first active region wherein the first image pattern has a first radiation energy per unit area of the photoresist layer, irradiating the photoresist layer with a second image pattern over the second active region wherein the second image pattern has a second radiation energy per unit area of the photoresist layer, etching the gate material to simultaneously form a first gate over the first active region and a second gate over the second active region wherein the first and second gates have different lengths primarily due to a difference between the first and second radiation energies per unit area, and forming sources and drains in the first and second active regions. In this manner, the difference in length between the first and second gates is not limited by the patterning capability of a single image pattern.

Forming the sources and drains may include implanting lightly doped source/drain regions into the first active region outside the first gate, implanting lightly doped source/drain regions into the second active region outside the second gate, forming first and second spacers adjacent to the first and second gates, implanting heavily doped source/drain regions into the first active region outside the first gate and first spacers, implanting heavily doped source/drain regions into the second active region outside the second gate and second spacers, and applying a high-temperature anneal to drive-in and activate the implanted dopants.

The difference between the first and second radiation energies per unit area can be achieved by using different exposure times, different radiation intensities, or both.

Preferably, the difference in lengths between the first and second gates is in the range of 20 to 500 angstroms, and more preferably in the range of 20 to 50 angstroms. Advantageously, the first and second gates can be electrically coupled to one another, and the difference in gate lengths can be used to adjust a drive current ratio between a first transistor in the first active region and a second transistor in the second active region that provide a CMOS inverter circuit.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

In the drawings, depicted elements are not necessarily drawn to scale and like or similar elements may be designated by the same reference numeral throughout the several views.

Figure 1A:
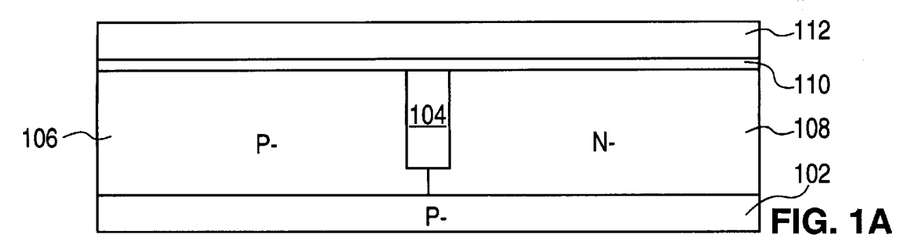
FIGS. 1A–1P show cross-sectional views of successive process steps for making N-channel and P-channel devices with different gate lengths in accordance with an embodiment of the invention.
Figure 1B:
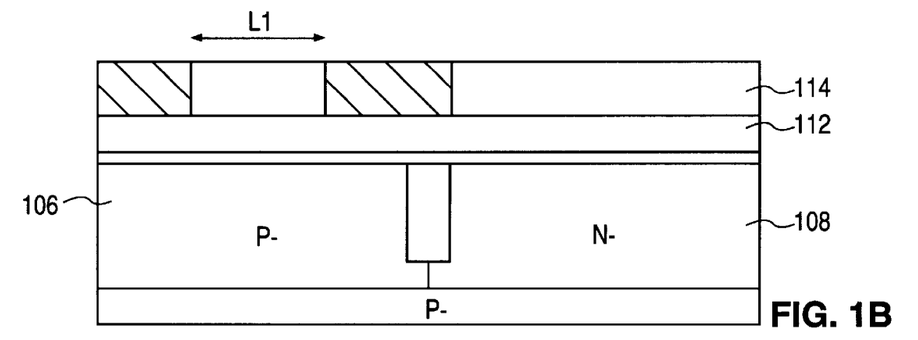
Figure 1C:
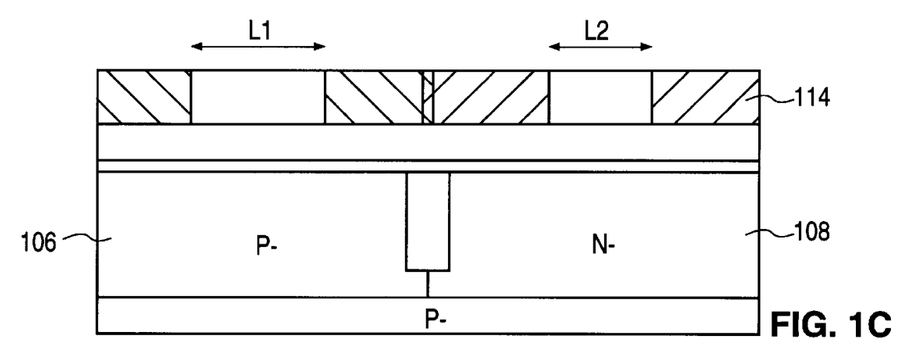
Figure 1D:
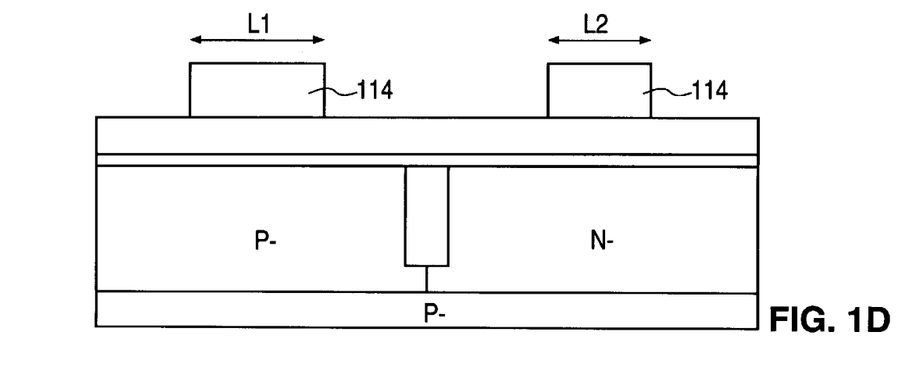
Figure 1E:
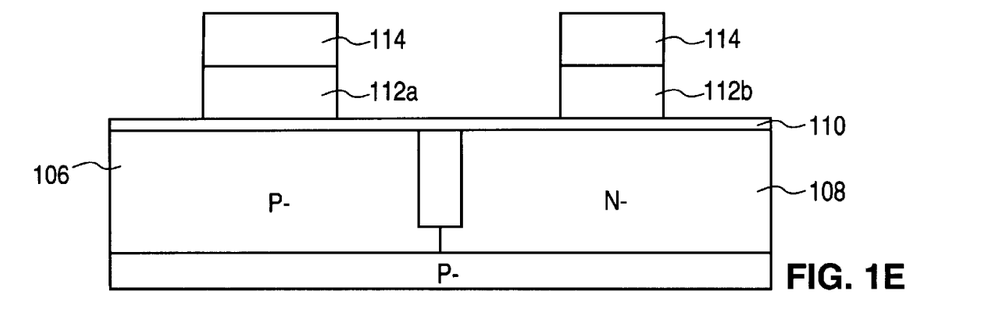
Figure 1F:
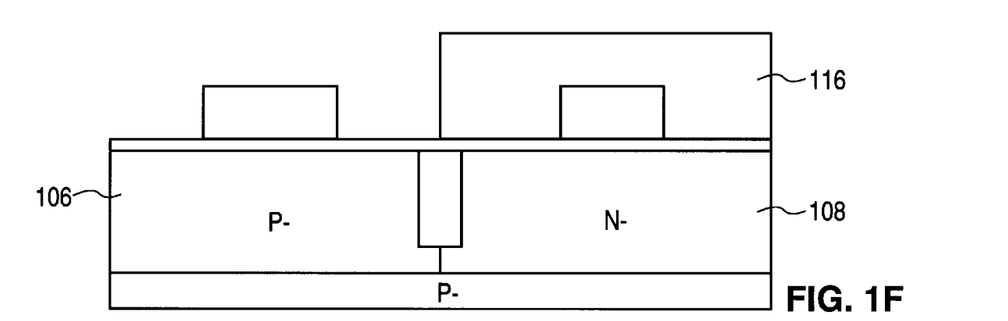
Figure 1G:
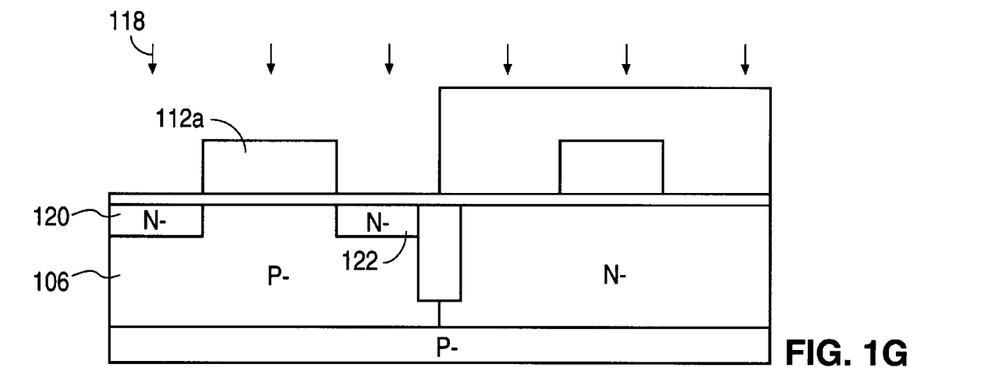
Figure 1H:
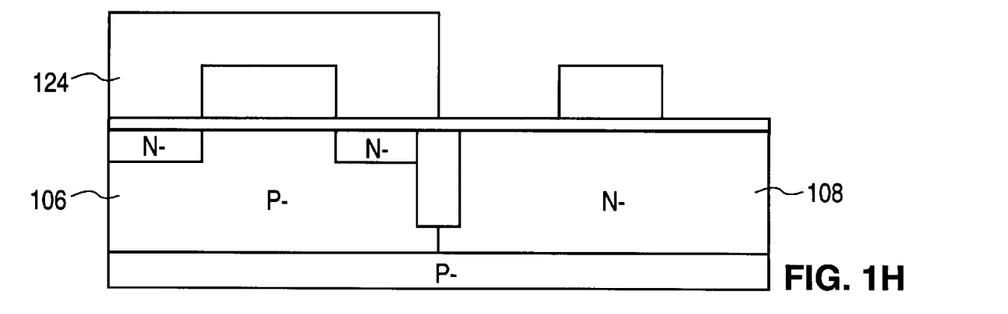
Figure 1I:
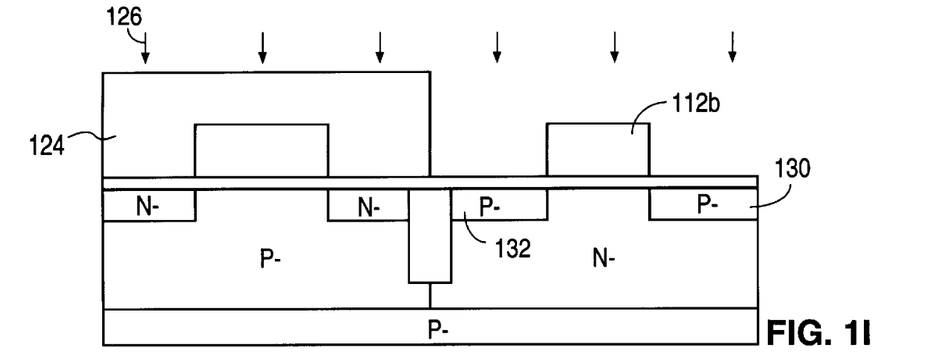
Figure 1J:
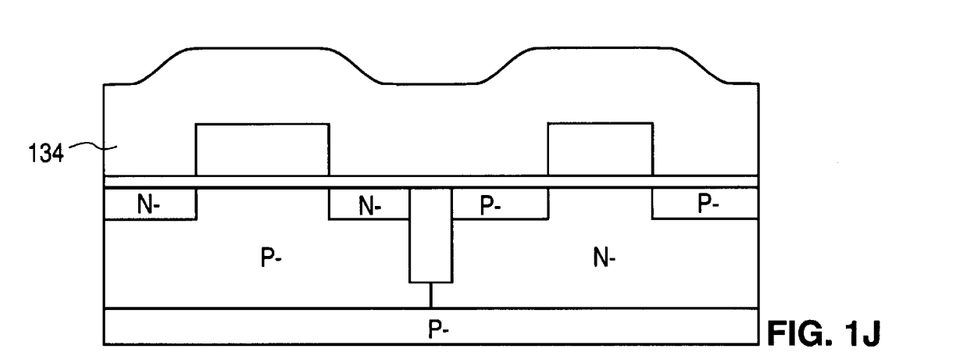
Figure 1K:
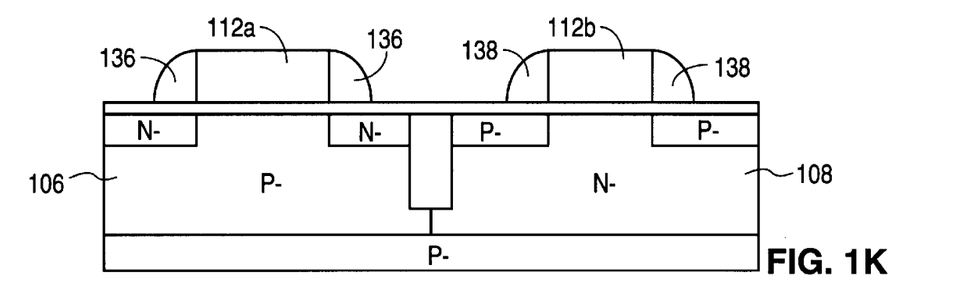
Figure 1L:
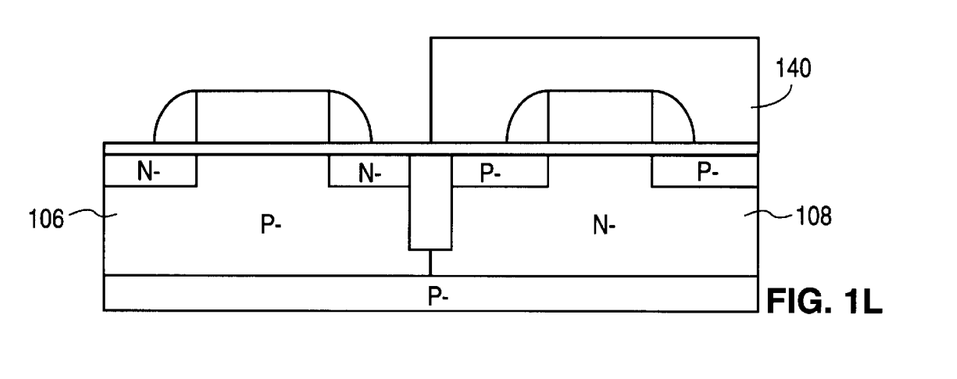
Figure 1M:
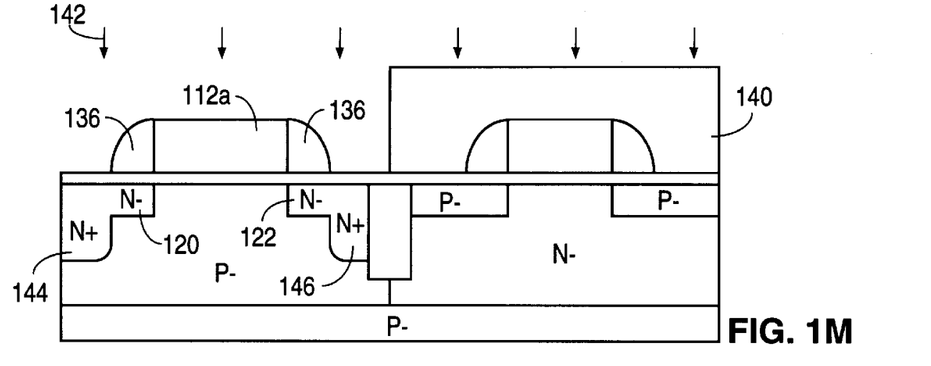
Figure 1N:
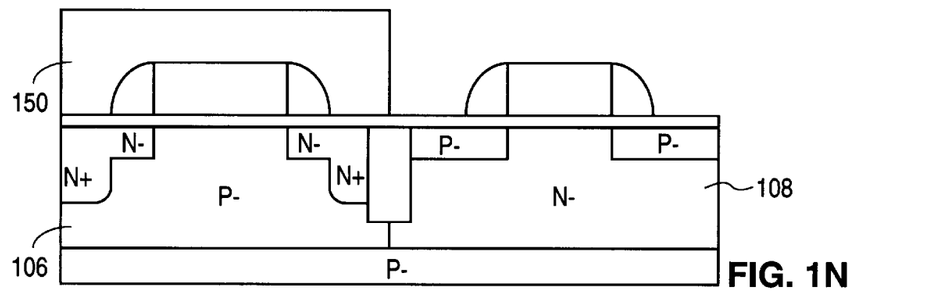
Figure 1O:
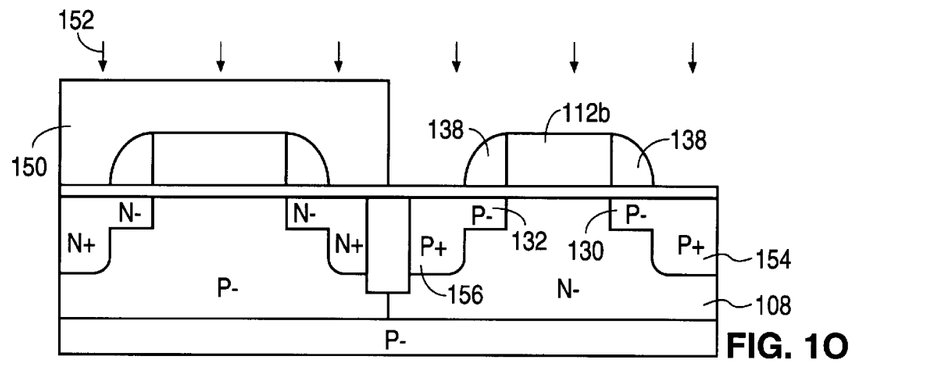
Figure 1P:
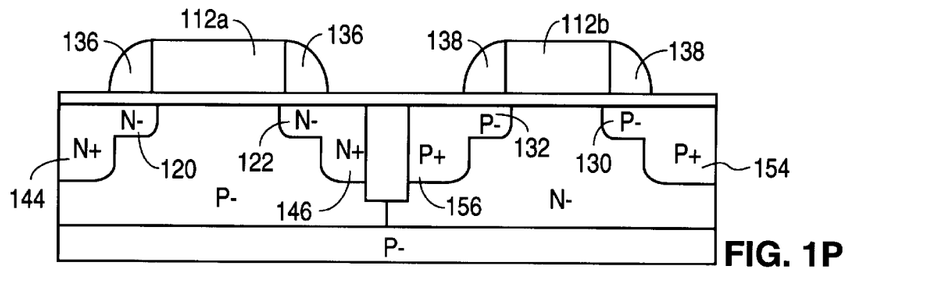

FIGS. 1A–1P show cross-sectional views of successive process steps for making N-channel and P-channel devices with different gate lengths in accordance with an embodiment of the invention.

In FIG. 1A, silicon substrate 102 suitable for integrated circuit manufacture is provided. Substrate 102 includes a P− type epitaxial surface layer disposed on a P+ base layer (not shown). Substrate 102 contains trench oxide 104 that provides dielectric isolation between P− type NMOS region 106 and N− type PMOS region 108 in the epitaxial surface layer. NMOS region 106 has a boron background concentration on the order of $1\times10^{15}$ atoms/cm$^3$, a <100> orientation and a resistivity of 12 ohm-cm. PMOS region 108 has an arsenic background concentration on the order of $1\times10^{15}$ atoms/cm$^3$, a <100> orientation and a resistivity of 12 ohm-cm. A blanket layer of gate oxide 110, composed of silicon dioxide ($SiO_2$), is formed on the top surface of substrate 102 using tube growth at a temperature of 700° to 1000° C. in an $O_2$ containing ambient. Gate oxide 110 has a thickness in the range of 30 to 100 angstroms. Thereafter, a blanket layer of undoped polysilicon 112 is deposited by low pressure chemical vapor deposition (LPCVD) on the top surface of gate oxide 110. Polysilicon 112 has a thickness of 2000 angstroms. If desired, polysilicon 112 can be doped in situ as deposition occurs, or doped before a subsequent etch step by implanting arsenic with a dosage in the range of $1\times10^{15}$ to $5\times10^{15}$ atoms/cm$^2$ and an energy in the range of 2 to 80 kiloelectron-volts. However, it is generally preferred that polysilicon 112 be doped during later processing steps.

In FIG. 1B, photoresist 114 is deposited on polysilicon 112. A photolithographic system, such as a step and repeat optical projection system which generates deep ultraviolet light from a mercury-vapor lamp, uses a first reticle to irradiate photoresist 114 with a first image pattern above portions of NMOS region 106 and outside PMOS region 108. The first image pattern is applied for a first exposure time, and defines a first unirradiated gap (where the light is blocked) over NMOS region 106. The regions of photoresist 114 that the first image pattern renders soluble to a subsequent developer are shown by the cross-hatched diagonal lines extending from the upper left to the lower right. Photoresist 114 above NMOS region 106 has a predetermined linewidth or length L1 of 3500 angstroms that remains insoluble to the developer.

In FIG. 1C, the photolithographic system uses a second reticle to irradiate photoresist 114 with a second image pattern above portions of PMOS region 108 and outside NMOS region 106 after the first image pattern is discontinued. The second image pattern, which has a different configuration than the first image pattern, is applied for a second exposure time that is longer than the first exposure time, and defines a second unirradiated gap (where the light is blocked) over PMOS region 108. The regions of photoresist 114 that the second image pattern renders soluble to the developer are shown by the cross-hatched diagonal lines extending from the upper right to the lower left. Photoresist 114 above PMOS region 108 has a predetermined linewidth or length L2 of 3450 angstroms that remains insoluble to the developer.

Of importance, the first and second unirradiated gaps have essentially identical lengths in the direction of lengths L1 and L2. However, length L2 is 50 angstroms smaller than length L1. This is achieved by providing the second image pattern with a longer exposure time than the first image pattern since, under appropriate conditions, a linear relationship exists between exposure time and photoresist linewidth change. See, for instance, SILICON PROCESSING FOR THE VLSI ERA, Volume 1: Process Technology, by S. Wolf and R. N. Tauber, published by Lattice Press, Sunset Beach, Calif., p. 437 (1986). During irradiation, the linewidths of photoresist 114 corresponding to lengths L1 and L2 decrease at about 10 angstroms per millijoule/cm$^2$. Therefore, providing the second image pattern with a longer exposure time than the first image pattern causes length L2 to be smaller than length L1. Moreover, the exposure times for the first and second image patterns can be adjusted to compensate for other factors, such as changes in intensity of the mercury-vapor lamp due to humidity, pressure or aging, that might otherwise affect lengths L1 and L2.

In FIG. 1D, the developer is applied to remove the regions of photoresist 114 rendered soluble by the first or second image patterns. The developer concentration, developer temperature and developer agitation method should be optimized so that the developer causes minimal pattern disruption, and the remaining photoresist 114 above NMOS region 106 and PMOS region 108 corresponds to lengths L1 and L2, respectively.

In FIG. 1E, an anisotropic dry etch is applied that removes the regions of polysilicon 112 exposed by the openings in photoresist 114. The dry etch is highly selective of polysilicon 112 and non-selective of gate oxide 110 so that only a negligible amount of gate oxide 110 is removed and substrate 102 is unaffected. After etching occurs, first gate 112a over NMOS region 106 has a length of 3500 angstroms, corresponding to length L1, and second gate 112b over PMOS region 108 has a length of 3450 angstroms, corresponding to length L2. The ratio of the gate lengths, L1/L2, is selected to provide a desired drive current ratio between NMOS and PMOS devices.

In FIG. 1F, photoresist 114 is stripped, and photoresist 116 is deposited over NMOS region 106 and PMOS region 108. The photolithographic system uses a third reticle to irradiate photoresist 116 with a third image pattern. Thereafter, photoresist 116 is developed and the irradiated portions are removed so that photoresist 116 contains an opening above the entire NMOS region 106 while photoresist 116 covers the entire PMOS region 108.

In FIG. 1G, lightly doped source and drain regions are implanted into NMOS region 106 by subjecting the structure to ion implantation of arsenic, indicated by arrows 118, at a dose in the range of $1 \times 10^{13}$ to $5 \times 10^{14}$ atoms/cm$^2$ and an energy in the range of 2 to 80 kiloelectron-volts, using first gate 112a and photoresist 116 as an implant mask. As a result, lightly doped source/drain regions 120 and 122 are implanted in NMOS region 106 and are self-aligned to the edges of first gate 112a. Lightly doped source/drain regions 120 and 122 are doped N− with an arsenic concentration in the range of about $1 \times 10^{17}$ to $1 \times 10^{18}$ atoms/cm$^3$ and a depth in the range of 100 to 1500 angstroms.

In FIG. 1H, photoresist 116 is stripped, and photoresist 124 is deposited over NMOS region 106 and PMOS region 108. The photolithographic system uses a fourth reticle to irradiate photoresist 124 with a fourth image pattern. Thereafter, photoresist 124 is developed and the irradiated portions are removed so that photoresist 124 contains an opening above the entire PMOS region 108 while photoresist 124 covers the entire NMOS region 106.

In FIG. 1I, lightly doped source and drain regions are implanted into PMOS region 108 by subjecting the structure to ion implantation of boron, indicated by arrows 126, at a dose in the range of $1 \times 10^{13}$ to $5 \times 10^{14}$ atoms/cm$^2$ and an energy in the range of 2 to 80 kiloelectron-volts using second gate 112b and photoresist 124 as an implant mask. As a result, lightly doped source/drain regions 130 and 132 are implanted in PMOS region 108 and are self-aligned to the edges of second gate 112b. Lightly doped source/drain regions 130 and 132 are doped P− with a boron concentration in the range of about $1 \times 10^{17}$ to $1 \times 10^{18}$ atoms/cm$^3$ and a depth in the range of 100 to 1500 angstroms.

In FIG. 1J, photoresist 124 is stripped, and silicon nitride (Si$_3$N$_4$) layer 134 with a thickness of 2500 angstroms is conformally deposited over the exposed surfaces by plasma enhanced CVD at a temperature in the range of 300° to 450° C.

In FIG. 1K, silicon nitride layer 134 is subjected to an anisotropic reactive ion etch (RIE) that forms sidewall spacers 136 over NMOS region 106 and adjacent to the opposing edges of first gate 112a, and sidewall spacers 138 over PMOS region 108 and adjacent to the opposing edges of second gate 112b. Spacers 136 cover portions of lightly doped source/drain regions 120 and 122 adjacent to first gate 112a, and spacers 138 cover portions of lightly doped source/drain regions 130 and 132 adjacent to second gate 112b.

In FIG. 1L, photoresist 140 is deposited over NMOS region 106 and PMOS region 108.

The photolithographic system uses the third reticle to irradiate photoresist 140 with the third image pattern. Thereafter, photoresist 140 is developed and the irradiated portions are removed so that photoresist 140 contains an opening above the entire NMOS region 106 while photoresist 140 covers the entire PMOS region 108.

In FIG. 1M, heavily doped source and drain regions are implanted into NMOS region 106 by subjecting the structure to ion implantation of arsenic, indicated by arrows 142, at a dose in the range of $1 \times 10^{15}$ to $5 \times 10^{15}$ atoms/cm$^2$ and an energy in the range of 2 to 80 kiloelectron-volts, using first gate 112a and spacers 136 and photoresist 140 as an implant mask. As a result, heavily doped source/drain regions 144 and 146 are implanted in NMOS region 106 and are self-aligned to the outside edges of spacers 136. Heavily doped source/drain regions 144 and 146 are doped N+ with an arsenic concentration in the range of about $1 \times 10^{18}$ to $1 \times 10^{20}$ atoms/cm$^3$ and a depth in the range of 200 to 3000 angstroms. Preferably, the depth of heavily doped source/drain regions 144 and 146 exceeds that of lightly doped source/drain regions 120 and 122.

In FIG. 1N, photoresist 140 is stripped, and photoresist 150 is deposited over NMOS region 106 and PMOS region 108. The photolithographic system uses the fourth reticle to irradiate photoresist 150 with the fourth image pattern. Thereafter, photoresist 150 is developed and the irradiated portions are removed so that photoresist 150 contains an opening above the entire PMOS region 108 while photoresist 150 covers the entire NMOS region 106.

In FIG. 1O, heavily doped source and drain regions are implanted into PMOS region 108 by subjecting the structure to ion implantation of boron, indicated by arrows 152, at a dose in the range of $1 \times 10^{15}$ to $5 \times 10^{15}$ atoms/cm$^2$ and an energy in the range of 2 to 80 kiloelectron-volts, using second gate 112b and spacers 138 and photoresist 150 as an implant mask. As a result, heavily doped source/drain regions 154 and 156 are implanted in PMOS region 108 and are self-aligned to the outside edges of spacers 138. Heavily doped source/drain regions 154 and 156 are doped P+ with a boron concentration in the range of about $1 \times 10^{18}$ to $1 \times 10^{20}$ atoms/cm$^3$ and a depth in the range of 200 to 3000 angstroms. Preferably, the depth of heavily doped source/drain regions 154 and 156 exceeds that of lightly doped source/drain regions 130 and 132.

In FIG. 1P, photoresist 150 is stripped, and the device is annealed to remove crystalline damage and to drive-in and activate the implanted dopants by applying a rapid thermal anneal on the order of 950° to 1050° C. for 10 to 30 seconds. Regions 120 and 144 form a source and regions 122 and 146 form a drain for an NMOS device in NMOS region 106. Likewise, regions 130 and 154 form a source and regions 132 and 156 form a drain for a PMOS device in PMOS region 108. Since the dopants diffuse both vertically and laterally, heavily doped regions 144 and 146 extend partially beneath spacers 136, and heavily doped regions 154 and 156 extend partially beneath spacers 138. Similarly, lightly doped regions 120 and 122 extend slightly beneath first gate 112a, and lightly doped regions 130 and 132 extend slightly beneath second gate 112b.

For illustration purposes, the NMOS and PMOS devices provide a CMOS inverter circuit with gates 112a and 112b electrically coupled together. Since, however, the first and second image patterns that define gates 112a and 112b are formed in sequence using two separate masks, the potential exists for misalignment or displacement between the regions of the gates intended to contact one another. A sufficient misalignment or displacement may prevent the gates from electrically coupling to one another, thereby causing the CMOS inverter circuit to become defective. Various stitching techniques for coupling elements patterned by separate masks can be used.

Figure 2:
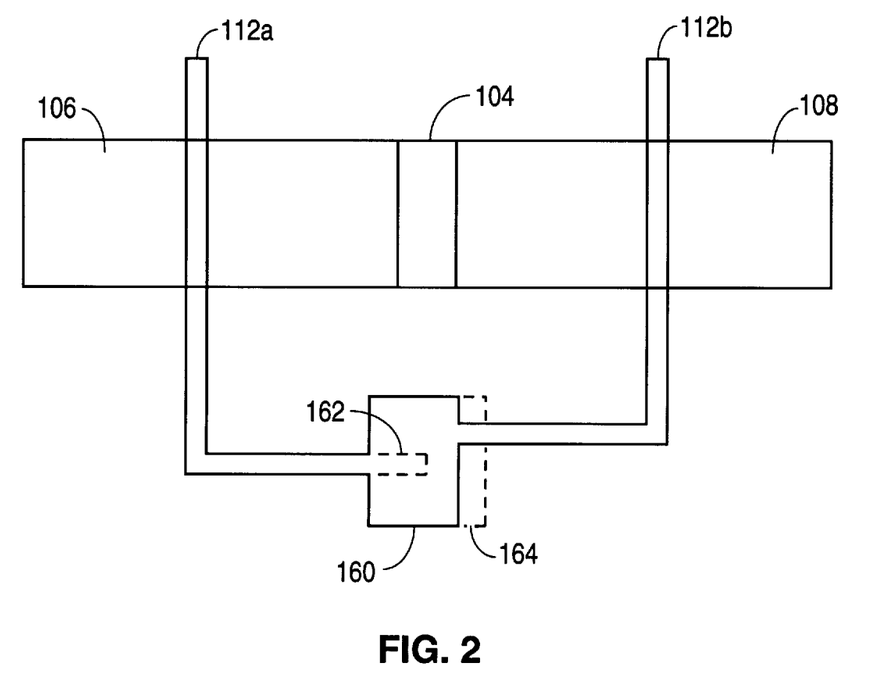
FIG. 2 shows a top plan view of a stitching technique for coupling the gates of the N-channel and P-channel devices.

FIG. 2 shows a top plan view of a stitching technique for coupling gates 112a and 112b. Gates 112a and 112b are shown above NMOS region 106 and PMOS region 108, respectively, with trench oxide 104 therebetween. Gate 112a and contact region 160 are defined by the first image pattern, and gate 112b is defined by the second image pattern. Broken lines 162 depict a distal end of gate 112a that would be formed in the absence of contact region 160. As is seen, gate 112b is misaligned both vertically and laterally with respect to gate 112a in the absence of contact region 160. However, contact region 160 compensates for this misalignment. Broken lines 164 depict a portion of contact region 160 defined by the first image pattern before the second image pattern is applied. When the second image pattern is applied, the portion of contact region 160 depicted by broken lines 164 is irradiated and therefore removed. Nonetheless, gate 112b is coupled by the remaining portion of contact region 160 to gate 112a despite the misalignment. Further details regarding this stitching technique are disclosed in U.S. application Ser. No. 08/805,534, filed concurrently herewith, entitled "Method of Stitching Segments Defined by Adjacent Image Patterns During the Manufacture of a Semiconductor Device" by Fulford, Jr. et al., which is incorporated herein by reference.

Further processing steps in the fabrication of IGFETs typically include forming salicide contacts on the gates, sources and drains, forming a thick oxide layer over the active regions, forming contact windows in the oxide layer to expose the salicide contacts, forming interconnect metallization in the contact windows, and forming a passivation layer over the metallization. In addition, earlier or subsequent high-temperature process steps can be used to supplement or replace the anneal step to provide the desired anneal, activation, and drive-in functions. These further processing steps are conventional and need not be repeated herein. Likewise the principal processing steps disclosed herein may be combined with other steps apparent to those skilled in the art.

The present invention includes numerous variations to the embodiment described above. For instance, the gate can be various conductors, the gate insulator and spacers can be various dielectrics, and the NMOS and PMOS regions can be isolated using various techniques such as LOCOS oxidation. The gate material can be patterned to provide a conductive line above the isolation region. The lightly doped source/drain regions for the PMOS device can be implanted before implanting the lightly doped source/drain regions for the NMOS device, and similarly, the heavily doped source/drain regions for the PMOS device can be implanted before implanting the heavily doped source/drain regions for the NMOS device. Furthermore, the LDDs are not essential. Suitable N-type dopants include arsenic and phosphorus; suitable P-type dopants include boron $B_{10}$, boron $B_{11}$, and $BF_X$ species such as $BF_2$. The difference in gate lengths is preferably in the range of 20 to 500 angstroms, and more preferably in the range of 20 to 50 angstroms.

Furthermore, several approaches can be used to provide the NMOS and PMOS devices with different gate lengths. For instance, variations in the linewidths of the photoresist layer above the NMOS and PMOS regions can be due primarily to variations in radiation intensity, radiation exposure time, or both, as long as the first and second image patterns exhibit a different radiation energy per unit area of photoresist.

The invention is particularly well-suited for fabricating N-channel MOSFETs, P-channel MOSFETs and other types of IGFETs, particularly for high-performance microprocessors where high circuit density is essential. Although a single pair of N-channel and P-channel devices has been shown for purposes of illustration, it is understood that in actual practice, many devices are fabricated on a single semiconductor wafer as widely practiced in the art. For instance, the first image pattern can be used to pattern gates for only N-channel devices on an integrated circuit chip, and the second image pattern can be used to pattern gates for only P-channel devices on an integrated circuit chip. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making N-channel and P-channel devices with different gate lengths, comprising the steps of:

providing a semiconductor substrate with first and second active regions;

forming a gate material over the first and second active regions;

forming a photoresist layer over the gate material;

irradiating the photoresist layer with a first image pattern over the first active region, wherein the first image pattern has a first radiation energy per unit area of the photoresist layer;

irradiating the photoresist layer with a second image pattern over the second active region, wherein the second image pattern has a second radiation energy per unit area of the photoresist layer;

developing the photoresist layer so that the photoresist layer includes a first photoresist segment over the first active region and a second photoresist segment over the second active region, wherein the first and second photoresist segments have different lengths primarily due to a difference between the first and second radiation energies per unit area;

etching the gate material using the photoresist layer as an etch mask after developing the photoresist layer to simultaneously form a first gate over the first active region and a second gate over the second active region, wherein the first and second gates have different lengths primarily due to the difference between the first and second radiation energies per unit area;

forming a source and drain in the first active region; and forming a source and drain in the second active region.

2. The method of claim 1, wherein:

the first radiation energy per unit area has a first exposure time;

the second radiation energy per unit area has a second exposure time; and the difference between the first and second radiation energies per unit area is due to a difference between the first and second exposure times.

3. The method of claim 1, wherein:

the first radiation energy per unit area has a first radiation intensity;

the second radiation energy per unit area has a second radiation intensity; and the difference between the first and second radiation energies per unit area is due to a difference between the first and second radiation intensities.

4. The method of claim 1, wherein the first and second image patterns provide first and second unirradiated gaps with essentially identical lengths over the first and second active regions.

5. The method of claim 1, wherein etching the gate material includes applying an anisotropic etch using the photoresist layer as an etch mask.

6. The method of claim 1, wherein forming the sources and drains includes:

implanting a dopant of first conductivity type into the first active region after forming the first gate; and implanting a dopant of second conductivity type into the second active region after forming the second gate.

7. The method of claim 1, wherein the difference in lengths between the first and second gates is in the range of 20 to 500 angstroms.

8. The method of claim 1, wherein the N-channel and P-channel devices are adjacent to an isolation region in the substrate.

9. The method of claim 1, including using the N-channel and P-channel devices in an integrated circuit chip.

10. The method of claim 1, including using the N-channel and P-channel devices in an electronic system including a microprocessor, a memory and a system bus.

11. A method of making N-channel and P-channel devices with different gate lengths, comprising the steps of:

providing a semiconductor substrate with first and second active regions;

forming a gate insulator on the first and second active regions;

forming a gate material on the gate insulator;

forming a photoresist layer over the gate material;

irradiating the photoresist layer with a first image pattern over the first active region for a first exposure time;

irradiating the photoresist layer with a second image pattern over the second active region for a second exposure time;

developing the photoresist layer to form first openings associated with the first image pattern and second openings associated with the second image pattern, wherein the photoresist layer includes a first photoresist segment over the first active region and a second photoresist segment over the second active region and the first and second photoresist segments have different lengths due to a difference between the first and second exposure times;

etching the gate material beneath the first and second openings using the photoresist layer as an etch mask after developing the photoresist layer to simultaneously form a first gate over the first active region and a second gate over the second active region, wherein the first and second gates have different lengths due to the difference between the first and second exposure times;

forming a source and drain in the first active region; and forming a source and drain in the second active region.

12. The method of claim 11, wherein:

irradiating the photoresist layer with the first image pattern decreases a linewidth of the photoresist layer that defines the length of the first gate at a rate of about 10 angstroms per millijoule/$cm^2$; and irradiating the photoresist layer with the second image pattern decreases a linewidth of the photoresist layer that defines the length of the second gate at a rate of about 10 angstroms per millijoule/$cm^2$.

13. The method of claim 11, wherein forming the sources and drains includes:

implanting a light dose of a dopant of first conductivity type into the first active region outside the first gate;

implanting a light dose of a dopant of second conductivity type into the second active region outside the second gate;

forming first spacers adjacent to the first gate and second spacers adjacent to the second gate;

implanting a heavy dose of a dopant of first conductivity type into the first active region outside the first gate and the first spacers; and implanting a heavy dose of a dopant of second conductivity type into the second active region outside the second gate and the second spacers.

14. The method of claim 11, wherein the first and second gates are electrically coupled to one another and the N-channel and P-channel devices provide an inverter circuit.

15. The method of claim 11, wherein the first and second active regions are adjacent to an isolation region in the substrate.

16. The method of claim 11, wherein the difference in lengths between the first and second gates affects a drive current ratio between the N-channel and P-channel devices.

17. The method of claim 11, wherein the difference in lengths between the first and second gates is in the range of 20 to 500 angstroms.

18. The method of claim 11, wherein the difference in lengths between the first and second gates is in the range of 20 to 50 angstroms.

19. The method of claim 11, wherein the gate material is polysilicon.

20. A method of making NMOS and PMOS devices with different gate lengths, comprising the following steps in the sequence set forth:

providing a semiconductor substrate with NMOS and PMOS regions that extend to a planar top surface of the substrate and are adjacent to an isolation region in the substrate;

forming a gate oxide on the NMOS and PMOS regions;

forming a polysilicon layer on the gate oxide;

forming a photoresist layer over the polysilicon layer;

irradiating the photoresist layer with a first image pattern over the NMOS region and outside the PMOS region for a first exposure time;

irradiating the photoresist layer with a second image pattern over the PMOS region and outside the NMOS for a second exposure time;

developing the photoresist layer to form first openings associated with the first image pattern and second openings associated with the second image pattern, wherein the photoresist layer includes a first photoresist segment with a first length over the first active region and a second photoresist segment with a second length over the second active region, and a difference between the first and second lengths of the first and second photoresist segments is in the range of 20 to 500 angstroms and is due to a difference between the first and second exposure times;

etching the polysilicon layer beneath the first and second openings using the photoresist layer as an etch mask to simultaneously form a first polysilicon gate with a first length over the NMOS region and a second polysilicon gate with a second length over the PMOS region, wherein the first and second polysilicon gates are electrically coupled to one another, and a difference between the first and second lengths of the first and second polysilicon gates is in the range of 20 to 500 angstroms and is due to the difference between the first and second exposure times; and forming an N-type source and drain in the NMOS region and a P-type source and drain in the PMOS region.

* * * * *